United States Patent [19]
Haragashira et al.

[11] Patent Number: 5,235,281
[45] Date of Patent: Aug. 10, 1993

[54] MAGNETIC RESONANCE IMAGING SYSTEM

[75] Inventors: Motoji Haragashira, Tochigi; Yoshiyuki Usui, Kuroiso, both of Japan

[73] Assignee: Kabushiki Kaisha Toshiba, Kawasaki, Japan

[21] Appl. No.: 720,919

[22] Filed: Jun. 25, 1991

[30] Foreign Application Priority Data

Jun. 27, 1990 [JP] Japan .................................. 2-166915

[51] Int. Cl.$^5$ .............................................. G01V 3/00
[52] U.S. Cl. ...................................... 324/318; 324/322
[58] Field of Search ............... 324/318, 319, 312, 322; 128/653.5

[56] References Cited

U.S. PATENT DOCUMENTS

| | | | |
|---|---|---|---|
| 4,794,338 | 12/1988 | Roemer et al. | 324/318 |
| 4,878,023 | 10/1989 | Overweg et al. | 324/318 |
| 4,916,395 | 4/1990 | Usui | 324/318 |

Primary Examiner—Louis Arana
Attorney, Agent, or Firm—Limbach & Limbach

[57] ABSTRACT

In an magnetic resonance imaging system of the echo planar imaging method, a gradient field Gx is generated by a linear type transconductance amplifier and gradient fields Gy and Gz are generated by an amplifier which is formed of a resonant type amplifier or a current type inverter for outputting a first current of a given waveform, a linear type transconductance amplifier for outputting a second current of an arbitrary waveform at a lower level than that of the first current, a gradient field coil having first and second windings for respectively running the first and second currents, the first and second windings being wound in a bifilar form, and a cancel coil for canceling a voltage induced by the gradient field coil, the cancel coil having third and fourth windings for respectively connected between the first winding and the resonant type amplifier or a current type inverter and between the second winding and the linear type transconductance amplifier, the third and fourth windings being wound in a bifilar form.

20 Claims, 17 Drawing Sheets

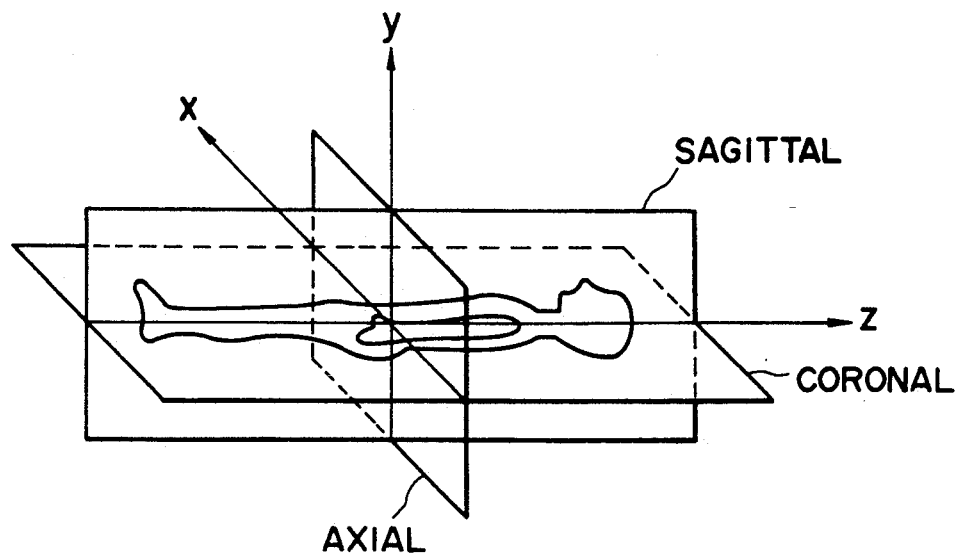
FIG. 6 (PRIOR ART)
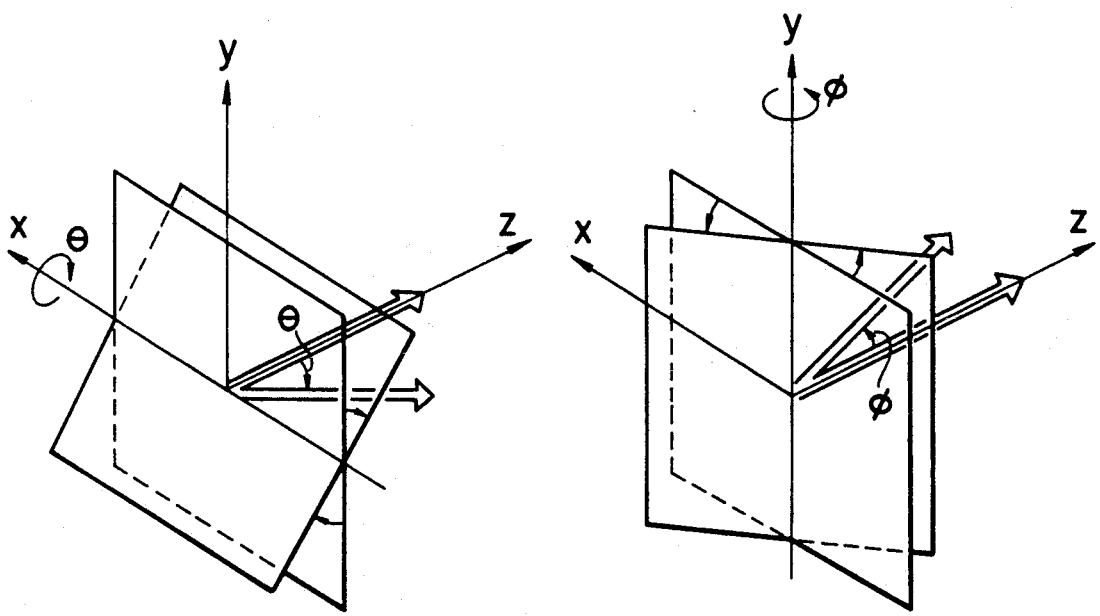
FIG. 7 (PRIOR ART)
FIG. 8 (PRIOR ART)

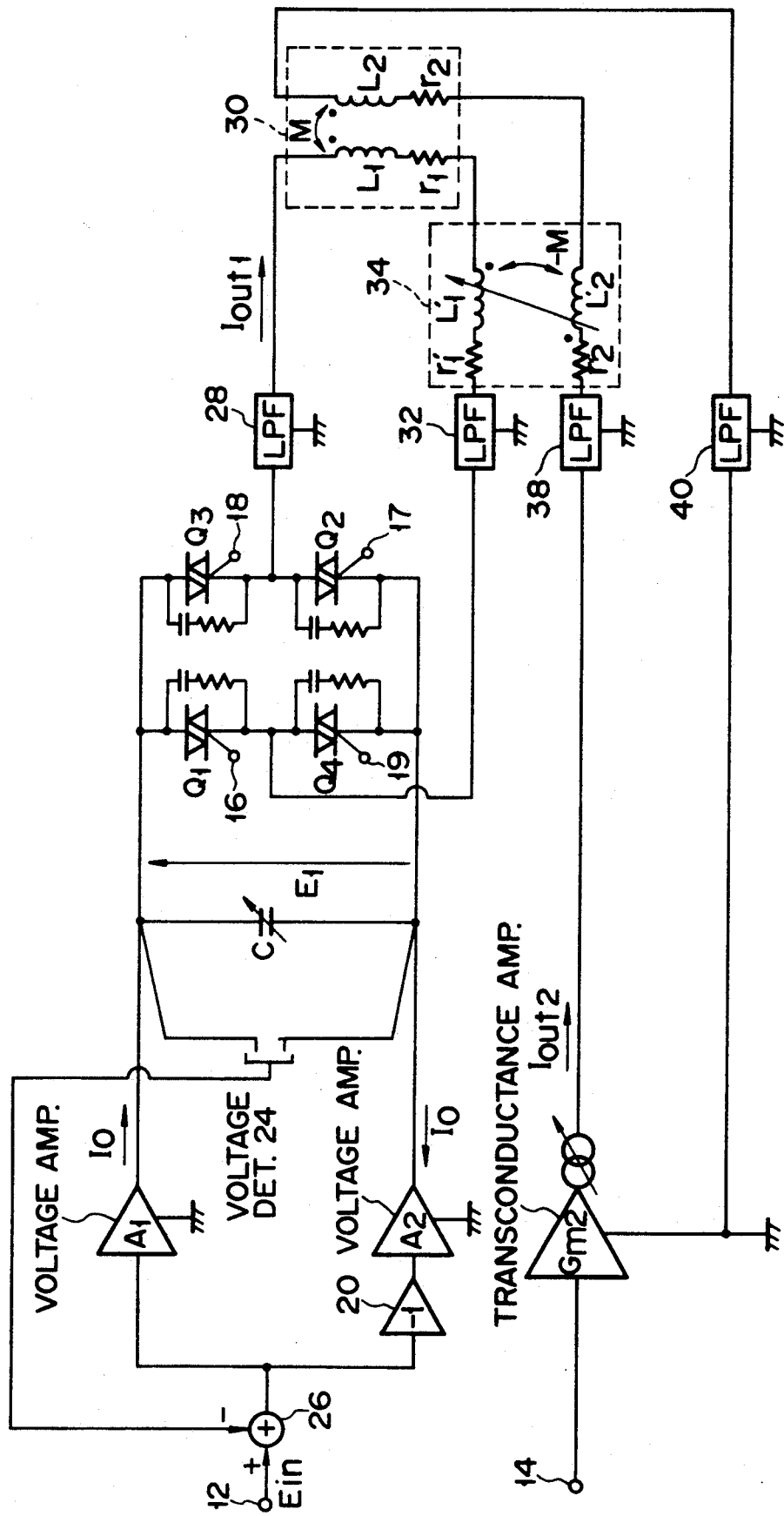
F I G. 12

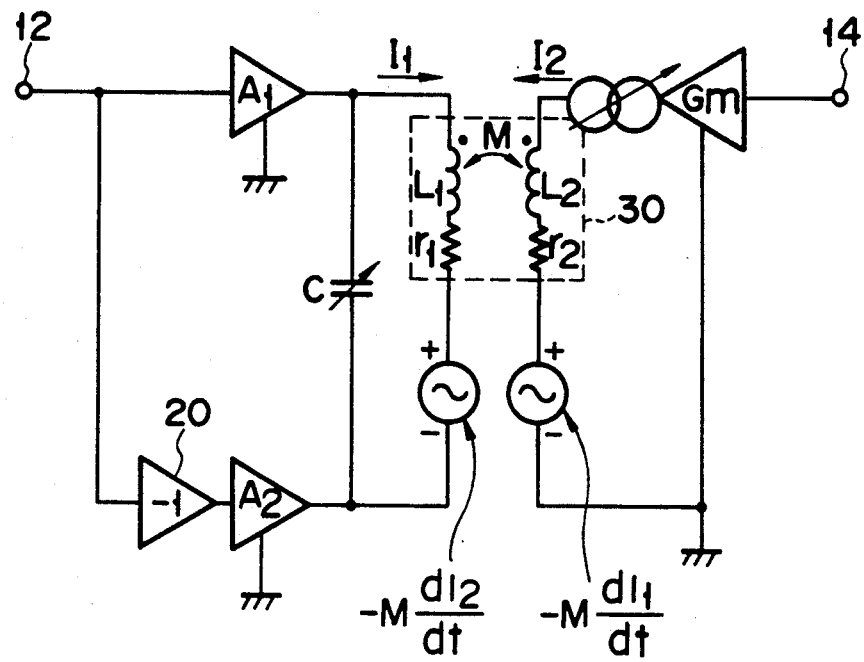
F I G. 15
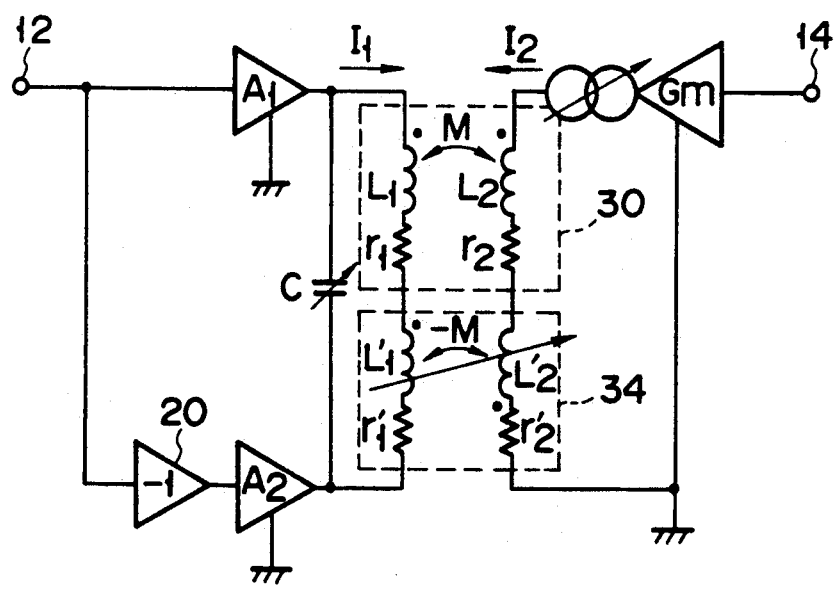
F I G. 16

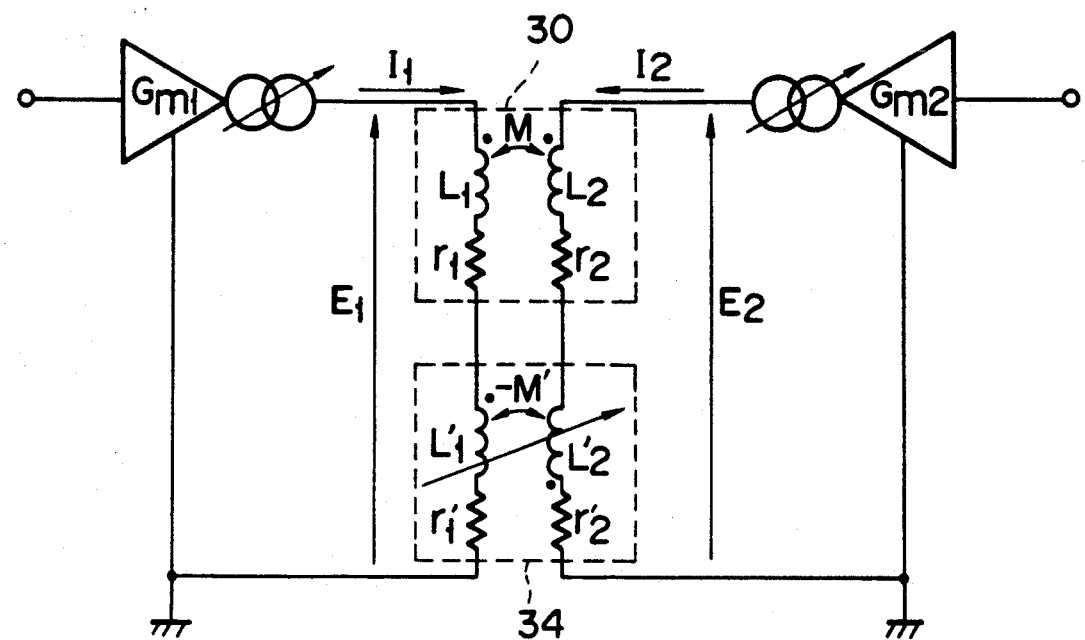
F I G. 17
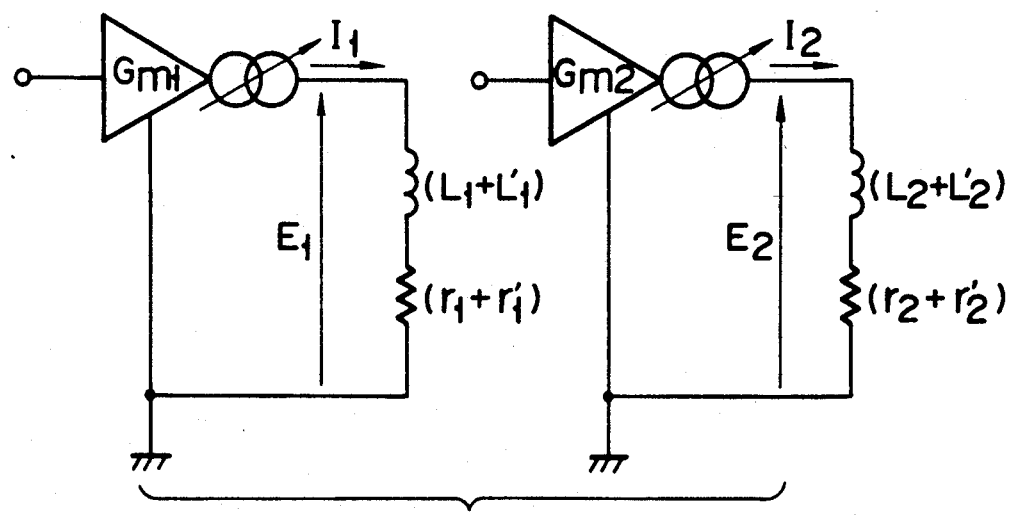
F I G. 18

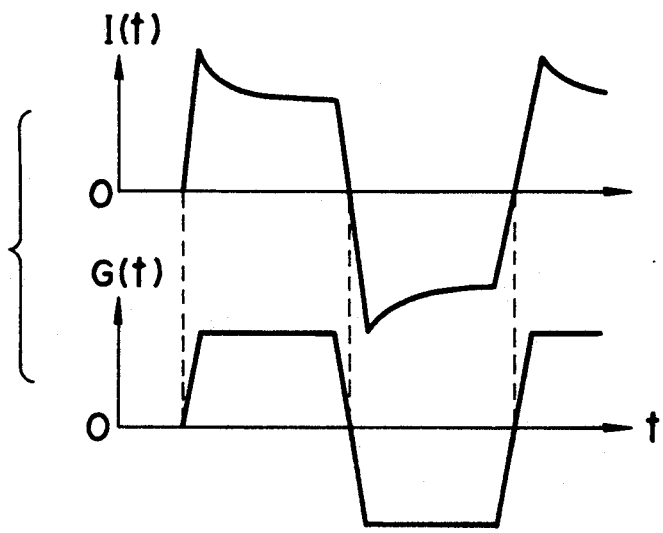
F I G. 22
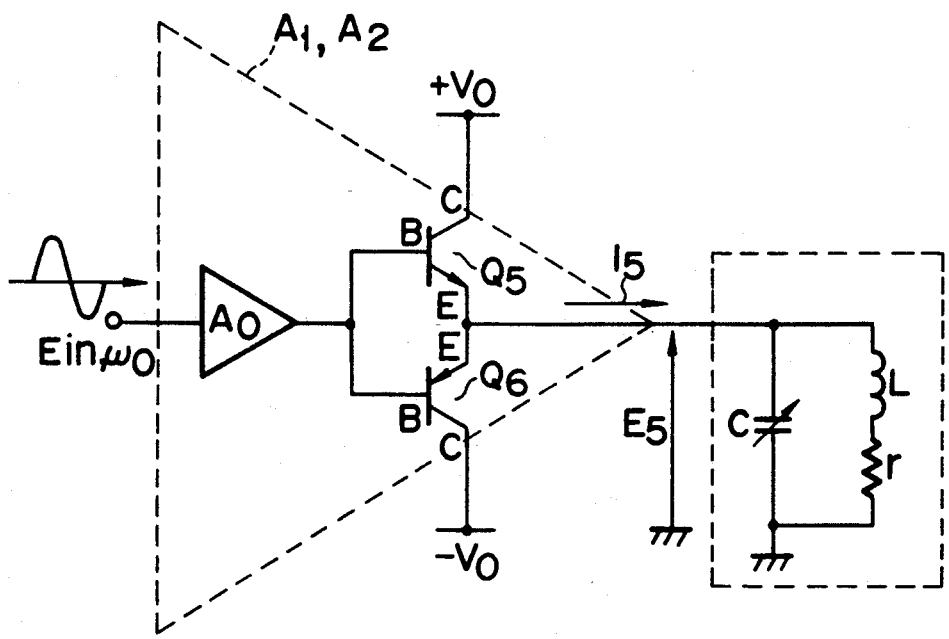
F I G. 23

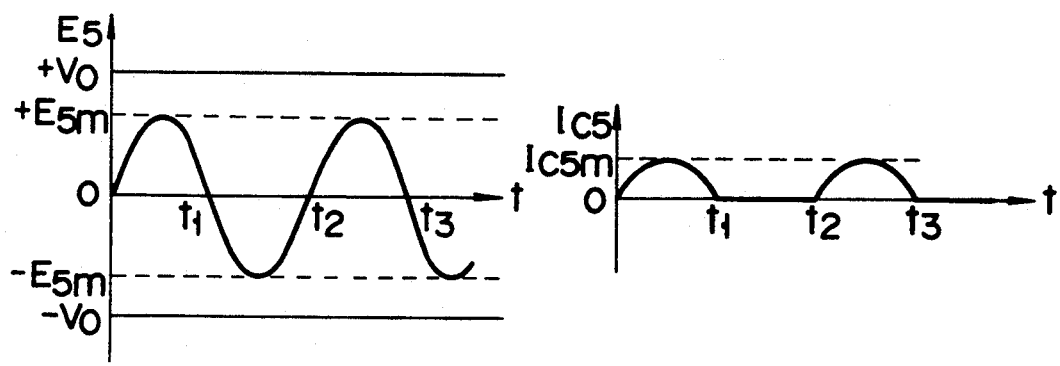
FIG. 24A
FIG. 24D
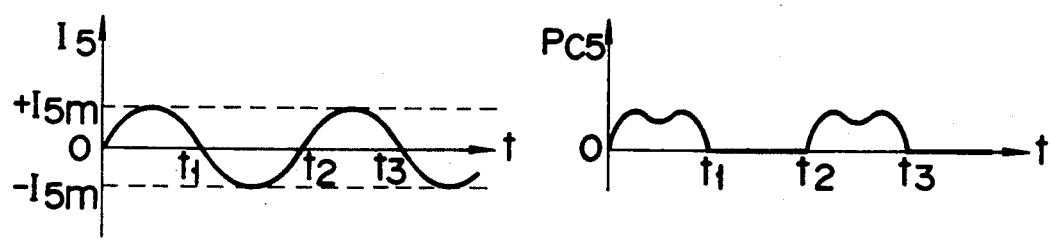
FIG. 24B
FIG. 24E
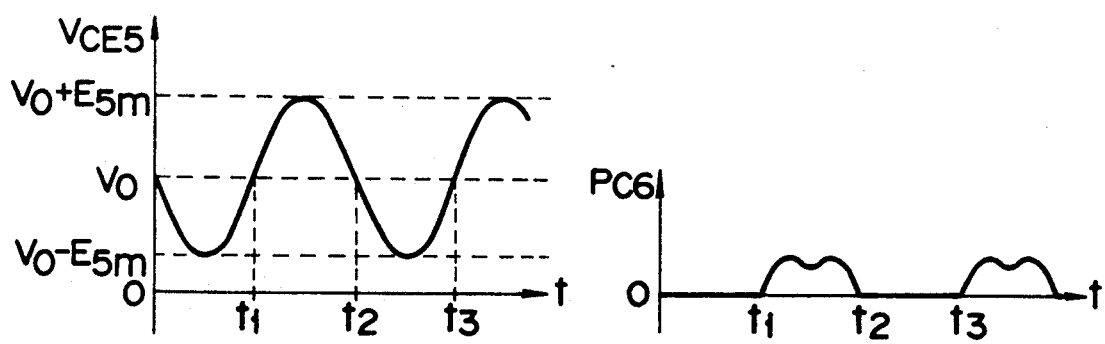
FIG. 24C
FIG. 24F

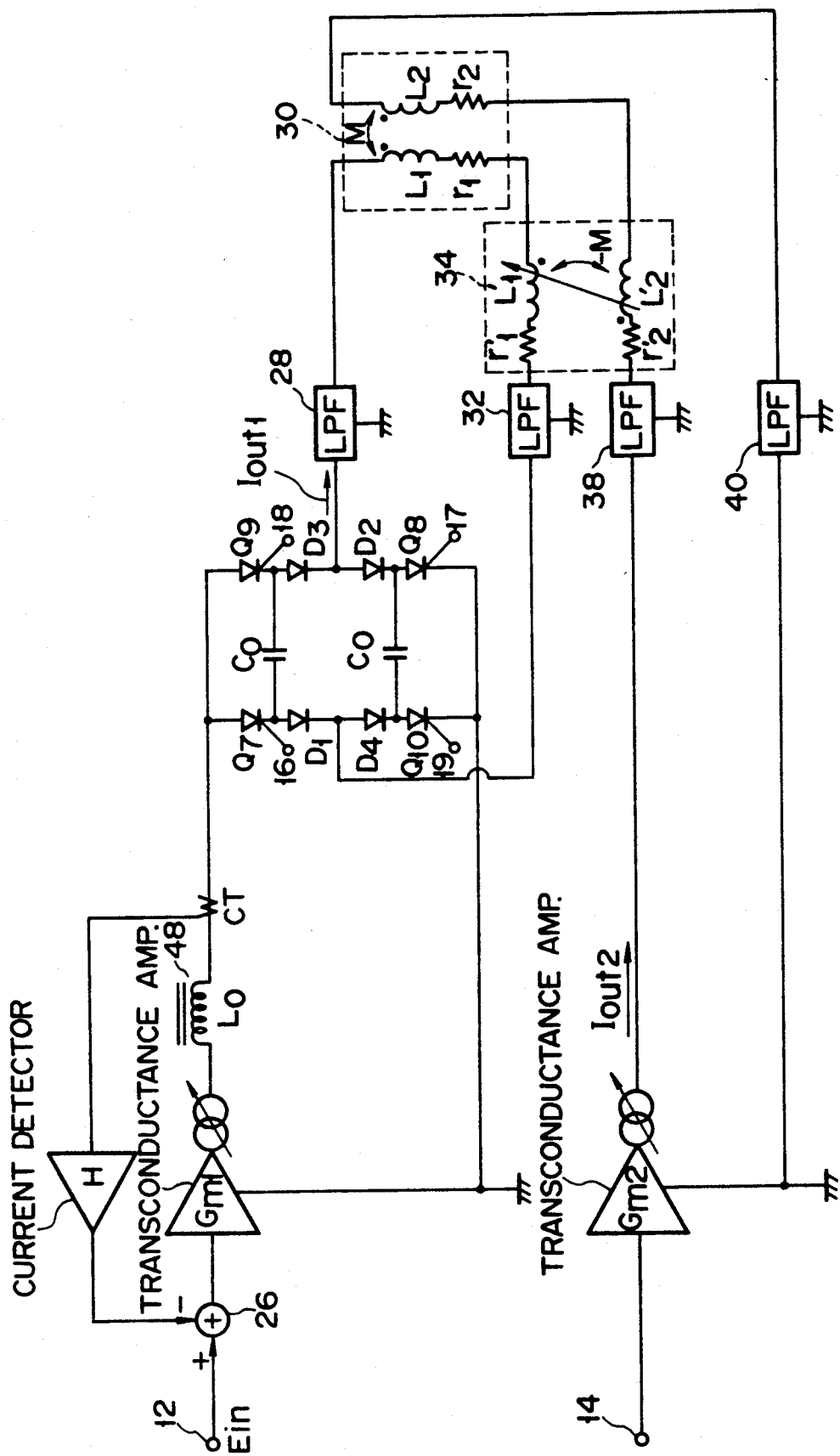
F I G. 26

MAGNETIC RESONANCE IMAGING SYSTEM

Background of the Invention

1. Field of the Invention

The present invention relates to a magnetic imaging system (hereinafter abbreviated as system), and more particularly to the MRI system which can scan an arbitrary oblique slice of an object by an echo planar imaging method.

2. Description of the Related Art

Recently, instead of a spin echo method, an echo planar imaging method has been developed which can ensure ultra fast imaging. A resonant type gradient field amplifying apparatus disclosed in U.S. Pat. No. 4,628,264 is one prior art of the gradient amplifying apparatus which generates a read-out gradient field in pulse sequence by the echo planar imaging method.

FIG. 1 illustrates the circuit diagram of this prior art. A voltage Vin is applied to voltage amplifiers 2a and 2b. A variable capacitor 4 is charged via the voltage amplifiers 2a and 2b. A series circuit comprising a bi-directional switch 6 and a gradient field coil equivalent to a series resistance 8 and an inductance 10 is connected between the terminals of the capacitor 4. While the bi-directional switch 6 is open, the capacitor 4 is charged by the amplifiers 2a and 2b. If the switch 6 is made conductive after the capacitor 4 has been charged, oscillation of a sine wave as shown in FIG. 2 starts. The phase of a voltage Vc between the terminals of the capacitor 4 (represented by the solid line in FIG. 2) leads the phase of current Ic flowing through the gradient field coil 10 (represented by the broken line in FIG. 2) by 90 degrees. FIG. 3 shows the trigger signal waveform of the switch 6.

According to this prior art, a current, which changes in sine-wave form as the time elapses, can be supplied to the gradient field coil 10. Since a gradient field generated from the gradient field coil 10 is proportional to the current flowing therethrough, the generated gradient field therefore has a sine waveform.

FIG. 4 shows a standard pulse sequence in the case where the echo planar imaging method is performed by using the above-described resonant type gradient field amplifying apparatus and two linear type transconductance amplifying apparatuses as either of X, Y, and Z gradient field amplifying apparatuses. FIG. 5 illustrates a pulse sequence in the case where the echo planar imaging method is performed by using three linear type transconductance amplifying apparatuses or a current type inverter and two linear type transconductance amplifying apparatuses. In the pulse sequence shown in FIG. 4, however even how a slice gradient field Gslice, a read-out gradient field Gread-out, and an encode gradient field Gencode correspond to gradient fields Gx, Gy, and Gz, an image of only an axial plane, coronal plane, or sagittal plane can be scanned. For example, when Gy=Gread-out, Gx=Gencode, and Gz=Gslice, the image of the axial plane can be obtained.

These axial, coronal, and sagittal planes are defined as illustrated in FIG. 6. With these planes, a tilt angle $\theta$ and a threw angle $\phi$ are defined respectively as shown in FIGS. 7 and 8. In other words, the tilt angle $\theta$ is an angle of inclination around the x-axis, while the threw angle $\phi$ is an angle of inclination around the y-axis. It is to be understood that an arbitrary slice can be designated by properly setting these angles $\theta$ and $\phi$. Suppose that the magnetic fields Gx, Gy, and Gz when the tilt angle $\theta=0$ and the threw angle $\phi=0$, where t represents the time of the sequence, are respectively Gxo(t), Gyo(t), and Gzo(t). When a given plane is inclined by the threw angle $\phi$ alone first and is then inclined by the tilt angle $\theta$, the magnetic fields Gx(t), Gy(t), and Gz(t) are expressed as follows:

$$Gx(t) = \sin\theta . Gzo(t) + \cos\theta . Gxo(t) \qquad (1)$$

$$Gy(t) = -\sin\phi . \cos\theta . Gzo(t) + \sin\theta . \sin\phi . Gxo(t) + \cos\theta . Gyo(t) \qquad (2)$$

$$Gz(t) = \cos\theta . \cos\phi . Gzo(t) - \cos\theta . \sin\phi . Gxo(t) + \sin\theta . Gyo(t) \qquad (3)$$

It is apparent from these three equations (1) to (3) that waveforms of the gradient fields Gx, Gy, and Gz become rather complicated to scan an arbitrary oblique slice ($\theta \neq 0$, $\phi \neq 0$). For example, substituting $\phi = \pi/4$ and $\theta = \pi/4$ into the equations (1) to (3), and further setting Gxo(t)=Gencode, Gyo(t)=Gread-out, and Gzo(t)=Gslice yields the following equations:

$$Gx(t) = 0.707 . Gslice(t) + 0.707 . Gencode(t) \qquad (4)$$

$$Gy(t) = -0.5 . Gslice(t) + 0.5 . Gencode(t) + 0.707 . Gread-out(t) \qquad (5)$$

$$Gz(t) = 0.5 . Gslice(t) - 0.5 . Gencode(t) + 0.707 . Gread-out(t) \qquad (6)$$

It is apparent from the equations (4) to (6) that waveforms of the gradient fields shown in FIG. 9 has to be generated to scan the oblique slice image at $\phi = \pi/4$ and $\theta = \pi/4$. During the pulse sequence of the MRI, the integrated value of a gradient magnetic filed for the positive period must be equal to that for the negative period. Therefore, it is necessary to change a frequency and/or an amplitude of the gradient magnetic field during the pulse sequence in order to generate the waveforms shown in FIG. 9. However, in the resonant type gradient field amplifying apparatus, a resonant frequency is determined in advance before the start of the pulse sequence, by setting the capacitance of the capacitor. Alteration of the frequency is very difficult after the pulse sequence has started. It is also difficult that the current Ic flowing through the gradient field coil is instantly changed, though being controlled according to the output voltages of the voltage amplifiers. Further, a gradient field having waveform other than the sine wave is hardly output because of the resonant operation. Because of the above reasons, it is very difficult to generate gradient field waveforms shown in FIG. 9 from the circuit structured as shown in FIG. 1. In other words, the image of an arbitrary oblique slice ($\theta \neq 0$, $\phi \neq 0$) cannot be scanned by a simply structured resonant type gradient field amplifying apparatus. FIG. 10 shows waveforms of the gradient fields in the case where a slice image at $\phi = \pi/4$ and $\phi = \pi/4$ is scanned, using three linear type transconductance amplifiers (linear amplifier receiving a voltage as its input and having its output proportional to the input).

As described above, there arises a shortcoming such that an arbitrary oblique slice of an object cannot be scanned by the echo planar imaging method with the resonant type gradient field amplifying apparatus. Although three linear type transconductance amplifying apparatuses can supply the currents of the waveforms shown in FIG. 10 to the gradient field coil, the linear type transconductance amplifying apparatus has low power efficiency and thus becomes too large and impractical.

According to the conventional resonant type amplifying apparatus, the maximum value of read-out gradient field Gread-out(t) is about 50 mT/m with respect to the maximum value of Gslice(t) and Gencode(t), 10 mT/m, whereby an eddy current originated from a superconductive magnet cannot be compensated for due to the strong read-out gradient field Gread-out(t).

With the use of the echo planar imaging method, it is inevitable that shimming be executed with an object enclosed by the magnet to uniformly adjust a static field at high accuracy. For instance, when the static field strength is 1.5 tesla within a sphere of a 300 mm diameter, the uniformity should be 1 ppm or less. While this normally necessitates the use of current shim coils, the magnetic coupling with the Gx, Gy, and Gz gradient field coils disturbs the current flowing across the shim coils, thus impairing the image quality. To avoid this shortcoming, instead of using the shim coils X, Y, and Z, a steady DC offset current is allowed to flow through the gradient coils Gx, Gy, and Gz. If a simple resonant type gradient field amplifying apparatus is used, no DC offset current cannot be allowed to flow, thus necessitating the use of the shim coils X, Y, and Z, in which case the magnetic coupling cannot be avoided unless an active shield type gradient field coil or the like is used as the gradient field coil.

Since the read-out gradient field Gread-out(t) has a sinusoidal waveform, the resonant amplifying apparatus should perform compensation, such as interpolation by over-sampling at the time of collecting MR signals or sampling performed at unequal intervals. This complicates the image reconstruction.

SUMMARY OF THE INVENTION

Accordingly, it is an object of the present invention to provide an MRI system having a compact and light gradient field amplifying apparatus, which is capable of scanning an arbitrary oblique slice by an echo planar imaging method.

Another object of the present invention is to provide an MRI system which compensates for the eddy current originated from a superconductive magnet due to a strong read-out gradient field.

Further object of the present invention is to provide an MRI system which uniformly adjusts a static field at high accuracy without using a current shim coil.

Still further object of the present invention is to provide an MRI system having a resonant type amplifying apparatus for generating the read-out gradient field, which does not necessitate compensation, such as interpolation by over-sampling at the time of collecting MR signals or sampling at unequal intervals.

According to one aspect of the present invention, there is provided an MRI system comprising:

means for generating a static field;

means for generating a gradient field which is superposed on the static field, the gradient field generating means comprising:

first means for outputting a first current of a given waveform;

second means for outputting a second current of an arbitrary waveform and a level lower than that of said first current;

a gradient field coil having first and second windings for respectively receiving said first and second currents, the first and second windings being provided closely and wound to respectively generate gradient fields in the same direction; and means, connected in series to said gradient field coil, for canceling a voltage induced from said gradient field coil;

means for transmitting a high-frequency pulse; and means for receiving a magnetic resonance echo signal from an object.

According to the present invention, the outputs of two current outputting means having different power efficiencies and different output waveforms are connected to a bifilar-winding gradient field coil and a cancel coil is connected to the gradient field coil, so that it is possible to generate a gradient field proportional to the linear sum of the outputs of the two current outputting means, thus permitting the MRI system to scan an arbitrary oblique slice by an echo planar imaging method.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 shows axial, coronal, and sagittal planes for explaining how to scan an arbitrary oblique slice;

FIG. 7 shows a tilt angle for explaining how to scan an arbitrary oblique slice;

FIG. 8 shows a threw angle for explaining how to scan an arbitrary oblique slice;

FIG. 12 is a block diagram showing a gradient field amplifying apparatus used in the first embodiment shown in FIG. 11;

FIG. 15 is an equivalent circuit diagram for explaining coupling between a resonant type amplifier and a linear transconductance amplifier;

FIG. 16 is an equivalent circuit diagram of the resonant type amplifier including the cancel coil;

FIG. 17 is an equivalent circuit diagram which generalizes the circuit diagram of FIG. 16;

FIG. 18 is an equivalent circuit diagram for explaining the operation of the cancel coil;

FIG. 22 shows a compensation for degradation of the gradient field waveform caused by the eddy current;

FIG. 23 is a diagram showing the final stage circuit of a voltage amplifier included in the gradient field amplifying apparatus shown in FIG. 12;

FIG. 24A to 24F are diagrams illustrating the operation of the final stage circuit of the voltage amplifier;

DETAILED DESCRIPTION OF THE PREFERRED EMBODIMENTS

Figure 11:
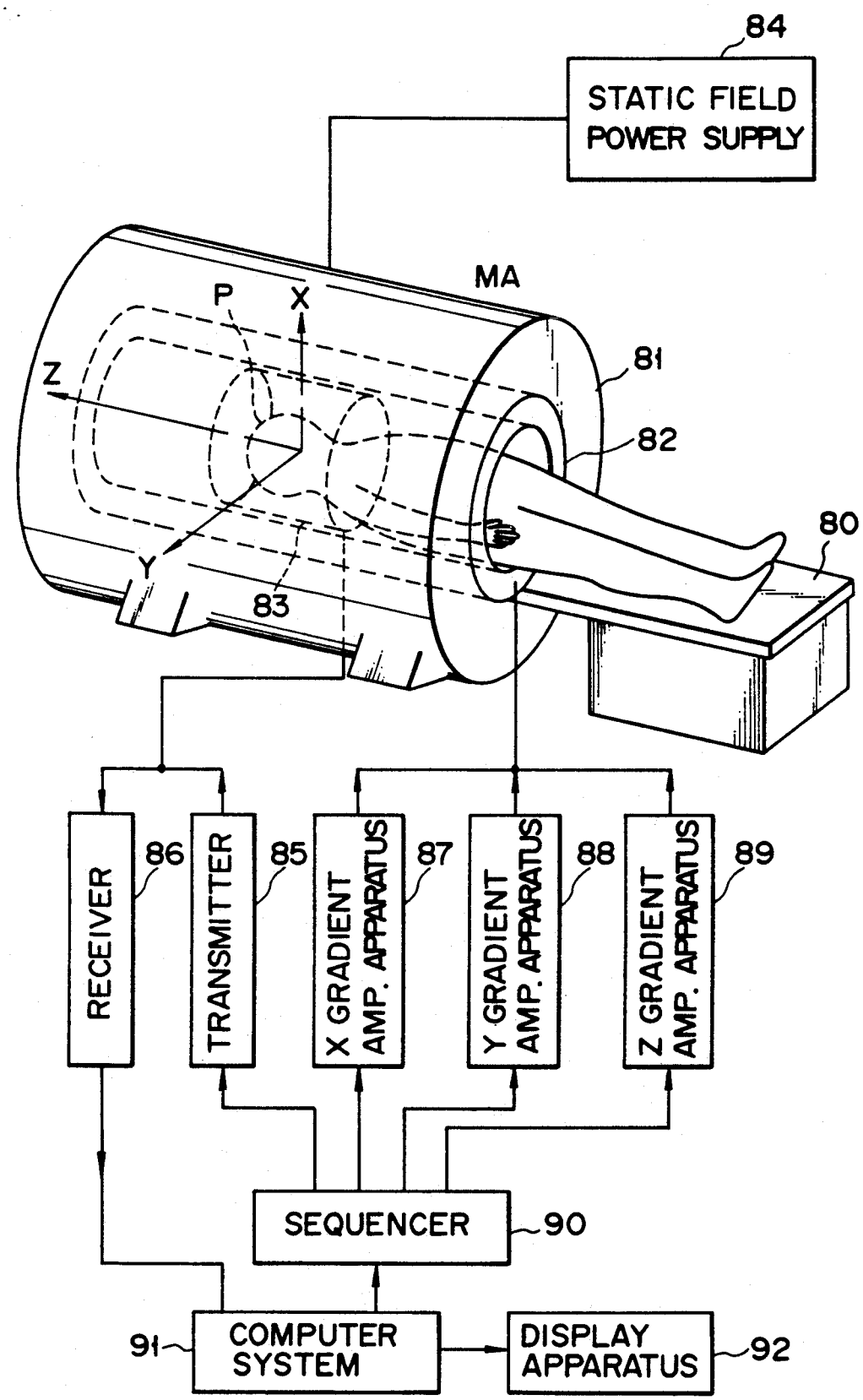
FIG. 11 is an overall block diagram showing a first embodiment of an MRI system according to the present invention.

A preferred embodiment of an MRI system according to the present invention will now be described with reference to the accompanying drawings. FIG. 11 shows a schematic arrangement of an overall MRI system according to the first embodiment of the present invention.

As shown in FIG. 11, a hollow portion is formed in a gantry MA so as to accommodate an object P to be examined. The gantry MA includes a normal conductive or superconductive static field coil system 81, a gradient coil system 82 for generating gradient fields Gx, Gy, and Gz in the x, y, and z directions, and a probe 83 constituted by a coil system for transmitting a radio-frequency pulse (RF pulse) and detecting an magnetic resonance signal (MR signal, e.g., an MR echo signal.) The object P is conveyed into a spherical imaging area in the gantry MA by the movement of the top plate of the bed 80.

The static field coil system 81 is energized by a static field power supply 84. The probe 83 is driven by a transmitter 85 during the period of magnetic resonance excitation and connected to a receiver 86 when the MR signal is to be detected. The gradient coil system 82 is driven by X, Y, and Z gradient amplifying apparatuses 87, 88, and 89.

The X, Y, and Z gradient amplifying apparatuses 87, 88, and 89 and transmitter 85 are controlled according to a predetermined pulse sequence by a sequencer 90 to generate the gradient fields Gx, Gy, and Gz and radio-frequency pulse. In this embodiment, the gradient fields Gx, Gy, and Gz are mainly used as a phase encode gradient field Gencode, a read-out gradient field Greadout, and a slice gradient field Gslice, respectively. A computer system 91 controls the sequencer 90 and performs signal processing of an MR signal detected by the receiver 86 based on a predetermined imaging method such as a Fourier transform method. A display apparatus 92 displays data obtained by the signal processing as an image.

The X gradient amplifying apparatus 87 is formed of a linear type transconductance amplifying apparatus and each of the Y and Z gradient amplifying apparatuses 88 and 89 is formed of an amplifying apparatus shown in FIG. 12. The details of the amplifying apparatus shown in FIG. 12 will be described.

An amplitude control signal Ein of a resonance current Iout1 and a waveform control signal of a second current Iout2 are respectively supplied to control terminals 12 and 14 from the sequencer 90 of FIG. 11. The amplitude control signal (voltage signal) Ein is supplied directly to a voltage amplifier A1 and via an inverter 20 to a voltage amplifier A2. A variable capacitor C is connected between the output terminals of the voltage amplifiers A1 and A2. A terminal voltage E1 ($\propto$ Ein) of the capacitor C is detected by a voltage detector 24, and is fed back negatively to the amplitude control signal Ein by an adder 26. To the capacitor C is connected in parallel a bridge circuit comprising bidirectional switches Q1 to Q4 of a triac type or the like. The individual bi-directional switches Q1 to Q4 have their control terminals 16 to 19 supplied with an ON/OFF control signal from the sequencer 90. A snubber circuit comprising a series circuit of a capacitor and a resistor is connected in parallel to each of the bi-directional switches Q1 to Q4.

The node between the bi-directional switches Q2 and Q3 is connected via a low-pass filter (LPF) 28 to one end of one of the two windings (L1, r1) of a bifilarwinding gradient field coil 30. The node between the bi-directional switches Q1 and Q4 is connected to the other end of that winding (L1, r1) of the gradient field coil 30 via one of the two windings (L1', r1') of a bifilar-winding cancel coil 34. The amplitude control terminal 12 and the control terminals 16 to 19 of the bi-directional switches Q1 to Q4 are terminals concerning the generation of a read-out gradient field. To generate the resonant current Iout1 having a sine waveform, the bi-directional switches Q1 and Q2 are turned on while the bi-directional switches Q3 and Q4 are turned off (or Q1 and Q2 are rendered off while Q3 and Q4 are rendered on). To stop the resonance, all the switches, i.e., the switches Q1 and Q2 are rendered off (or Q3 and Q4 are rendered off) at the timing of Iout1=0. The amplifiers A1 and A2, the capacitor C, and the switches Q1 to Q4 constitute a resonant type amplifier.

The control terminal 14 to which the waveform control signal is applied is connected to a linear type transconductance amplifier Gm2 which outputs a current proportional to its input voltage. The output current Iout2 of the transconductance amplifier Gm2 is supplied via an LPF 38 and the other winding (L2', r2') of the cancel coil 34 to the other winding (L2, r2) of the gradient field coil 30, and is further grounded through an LPF 40. The LPFs 28, 32, 38, and 40 serve to cut off noise near the resonant frequency; the influence of the noise around the operation frequency of the gradient field amplifying apparatus can be neglected. The waveform control terminal 14 is associated with the generation of an encode and slice gradient fields.

Figure 13:
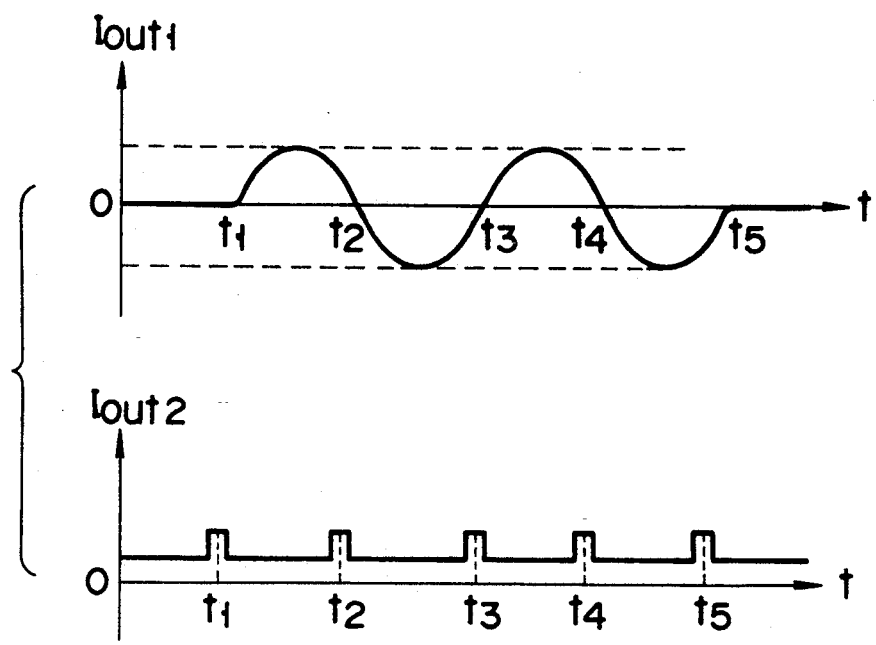
FIG. 13 shows current waveforms of the gradient field amplifying apparatus shown in FIG. 12.

FIG. 13 illustrates the waveforms of the currents Iout1 and Iout2 flowing across the respective windings of the gradient field coil 30.

Figure 14:
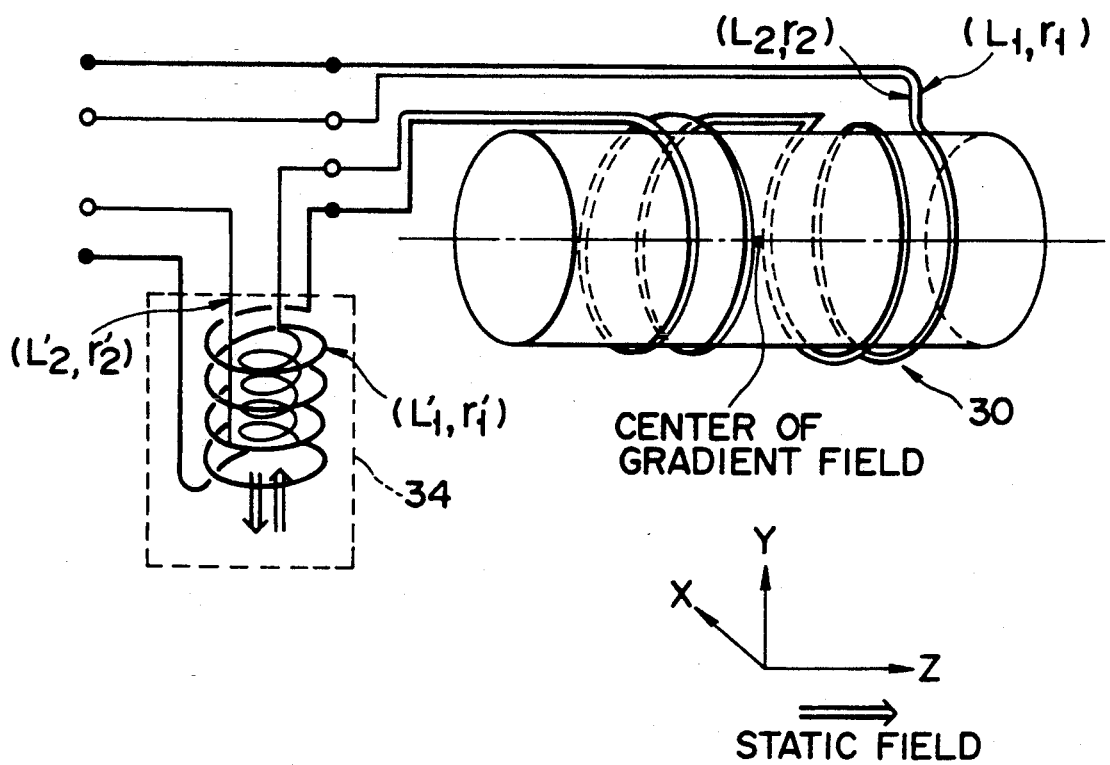
FIG. 14 is a detailed diagram showing a gradient field coil and a cancel coil used in the gradient field amplifying apparatus shown in FIG. 12.
Figure 29:
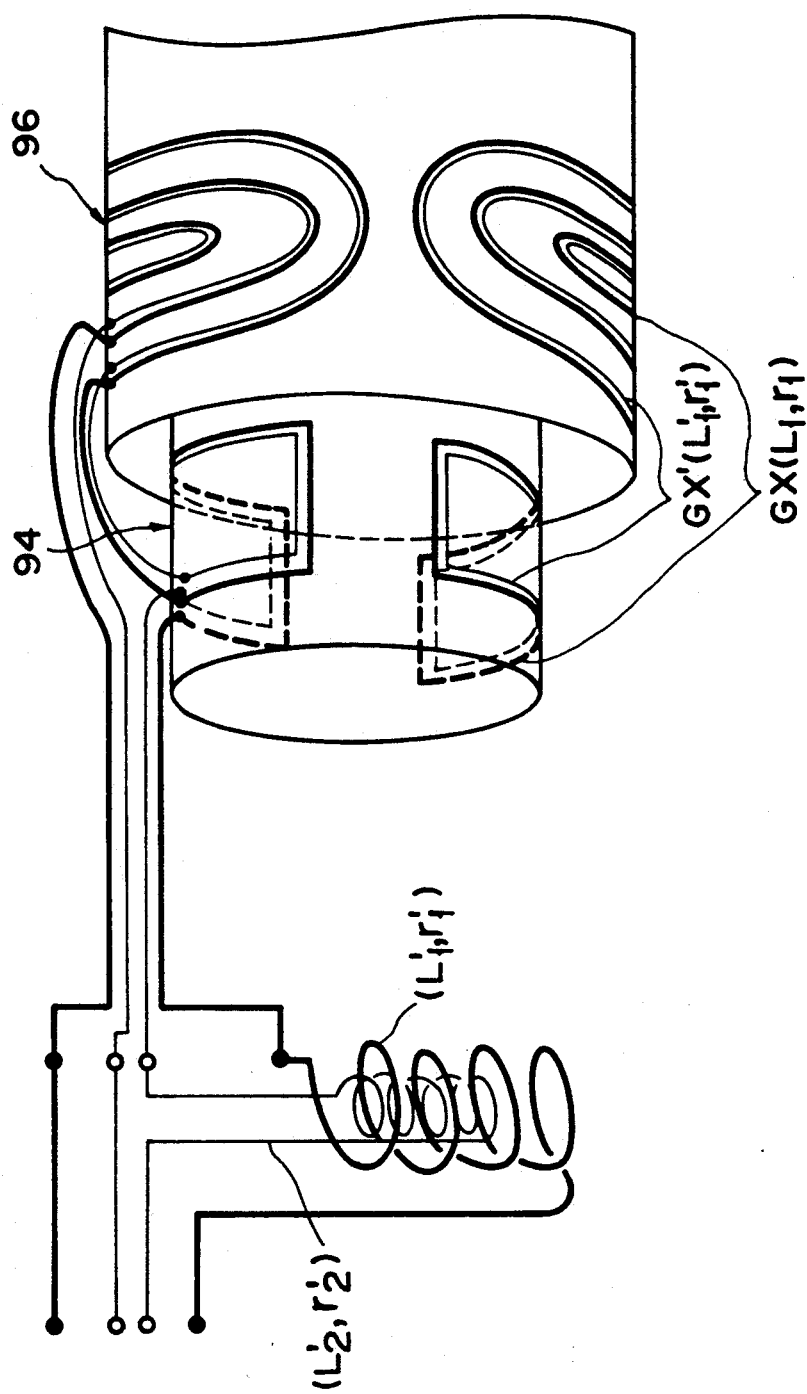
FIG. 29 is a first modification of the gradient field coil and the cancel coil used in the gradient field amplifying apparatus.
Figure 30:
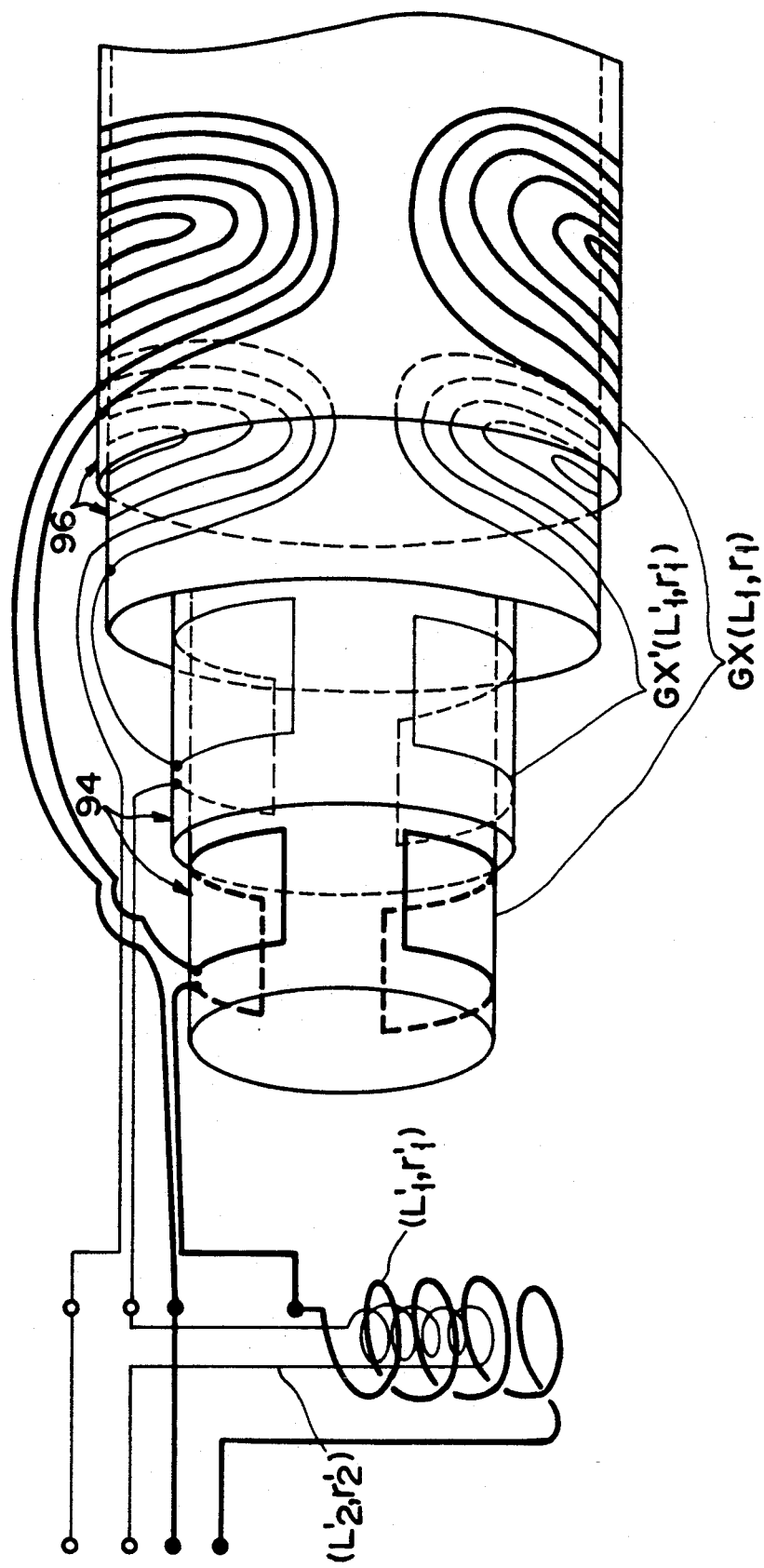
FIG. 30 is a second modification of the gradient field coil and the cancel coil used in the gradient field amplifying apparatus.

FIG. 14 presents a detailed illustration of the gradient field coil 30 and cancel coil 34. According to this embodiment, to couple the output of the resonant type amplifying apparatus comprising the voltage amplifiers A1 and A2 and the capacitor C to the output of the linear type transconductance amplifier Gm2 as a gradient field, a bifilar-winding coil is used for the gradient field coil 30. As shown in FIG. 14, the "bifilarwinding" is what results from two windings (which are drawn by the thick line and thin line) put together with the insulation maintained therebetween and are wound in this state into a coil as if they are one conductive wire. FIG. 14 illustrates the gradient field coil for Gz. FIG. 29 illustrates the active shield gradient field coil for Gx. In FIG. 29, a primary coil 94 is inserted in a screen coil 96. The active shield gradient field coil may be formed in a nesting structure as shown in FIG. 30.

If the gradient field coil 30 is designed simply into a bifilar-winding, a voltage $-M(dI1/dt)$ will be induced on the side of the winding (L2, r2) due to the output current I1 of the voltage amplifier 16 as shown in FIG. 15. For instance, with $I1 \approx 850$ A and the rising time $t_{rise} \approx 0.1 \times 10^{-3}$ sec, $M = k\ L1 \approx 0.7 \times 600 \times 10^{-6}$ H, the absolute value $|-M(dI1/dt)|$ becomes as high as about 3570 V. Likewise, a voltage $-M(dI2/dt)$ will be induced on the side of the winding (L1, r1) due to the output current I2 of the linear amplifier 36. With $I2 \approx 170$ A and $t_{rise} \approx 0.1 \times 10^{-3}$ sec, $M \approx 4.2 \times 10^{-4}$ H, the absolute value of this induction voltage becomes approximately 714 V. Under the conditions, therefore, the voltage amplifiers A1 and A2 may be damaged or the transconductance amplifier Gm2 may be broken, so that the simple bifilar-winding design is hardly practical.

Figure 1:
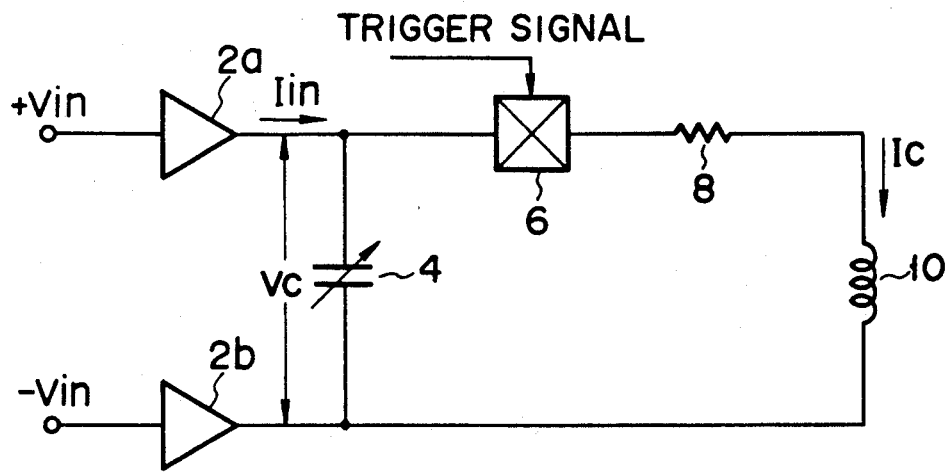
FIG. 1 is a block diagram of a conventional resonant type gradient field amplifying apparatus.
Figure 2:
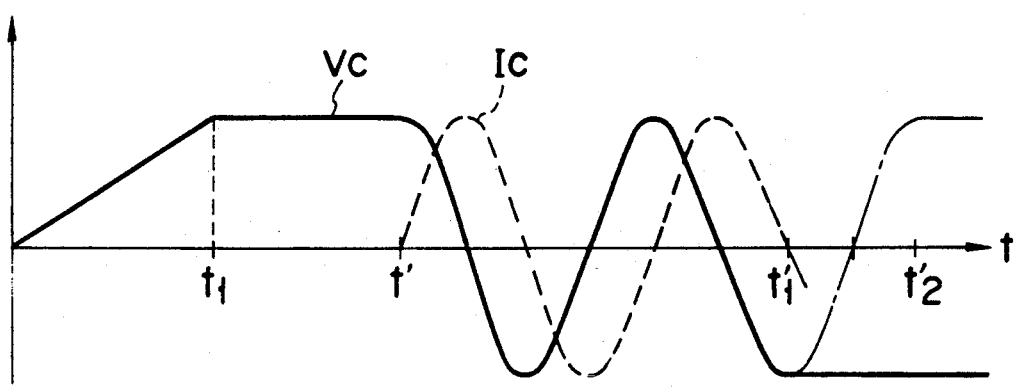
FIG. 2 shows the oscillation state of the apparatus shown in FIG. 1.
Figure 3:
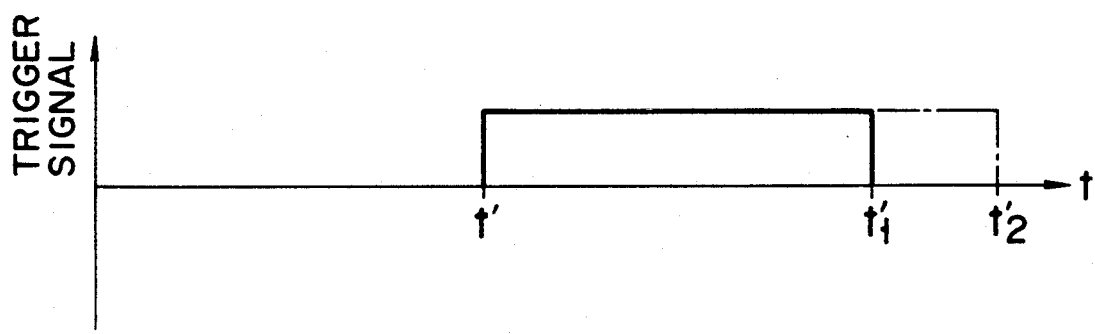
FIG. 3 shows a timing at which the trigger signal is supplied, to the apparatus shown in FIG. 1.
Figure 4:
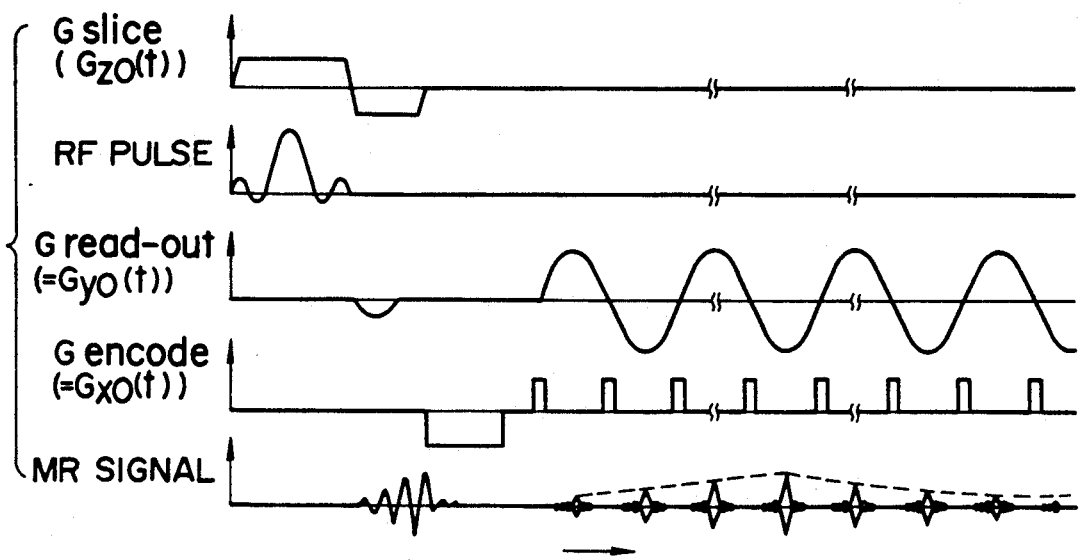
FIG. 4 is a diagram exemplifying a pulse sequence in the case where the echo planar imaging method is performed by using a resonant type gradient field amplifying apparatus and two linear type transconductance amplifying apparatuses.
Figure 5:
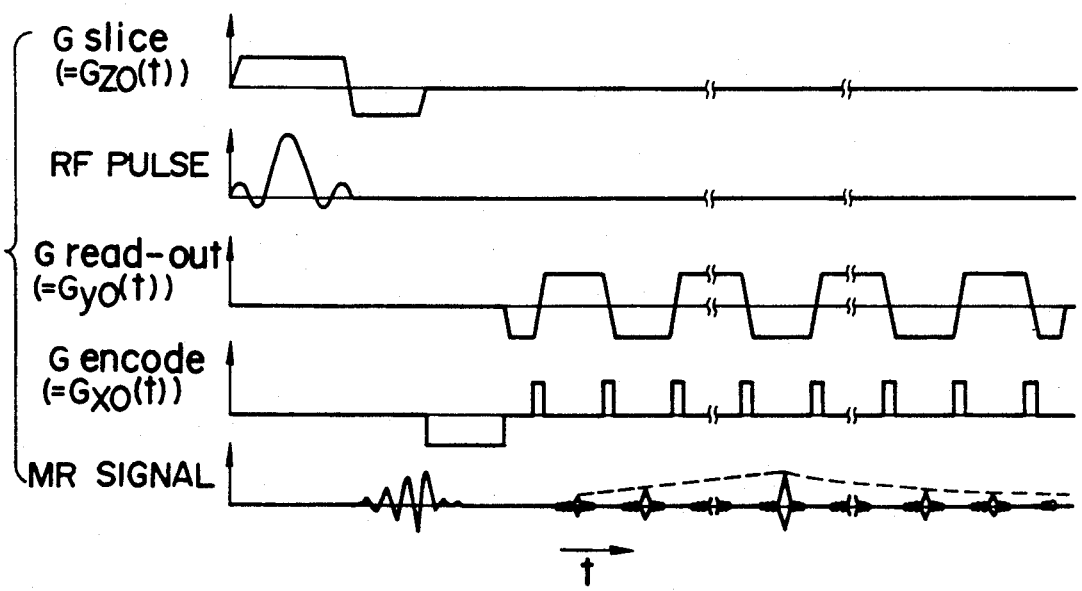
FIG. 5 is a diagram exemplifying a pulse sequence in the case where the echo planar imaging method is performed by using three linear type transconductance amplifying apparatuses.

According to this embodiment, therefore, the cancel coil 34 is connected in series to the gradient field coil 30, as shown in FIG. 16. FIG. 17 is a circuit diagram which is obtained by redrawing FIG. 5 for easier and quantitative explanation of the operation of the cancel coil 34. In FIG. 17, a transconductance amplifier Gm1 is used for the resonant type amplifier A1, A2, and C on the left side in FIG. 16 for the purpose of generalization. From FIG. 17, the following equations are obtainable:

$$I1 \cdot r1 + I1 \cdot r1' = E1 - L1(dI1/dt) - L1'(dI1/dt) - M(dI2/dt) + M'(dI2/dt) \quad (7)$$

$$I2 \cdot r2 + I2 \cdot r2' = E2 - L2(dI2/dt) - L2'(dI2/dt) - \quad (8)$$

$$M(dI2/dt) + M'(dI2/dt)$$

Adjusting the inductance of the cancel coil 34 and setting $M = M'$, the equations (7) and (8) will be rewritten as follows:

$$(L1+L1')(dI1/dt)+I1(r1+r1')=E1 \quad (9)$$

$$(L2+L2')(dI2/dt)+I2(r2+r2')=E2 \quad (10)$$

The equations (9) and (10) will be illustrated as given in FIG. 18. As the mutual inductance M' of the cancel coil 34 is adjusted equal to the mutual inductance M of the gradient field coil 30, it can be regarded that the transconductance amplifier Gm1 is connected with a load which comprises only the inductance $(L1+L1')$ and the resistance $(r1+r1')$. Likewise, it ca be regarded that the transconductance amplifier Gm2 is connected with a load which comprises only the inductance $(L2+L2')$ and the resistance $(r2+r2')$. The influence of the induced voltage is compensated for by the cancel coil 34 in this manner. While there would arise no practical problem if the cancel coil is of an iron-core type, it is desirable to employ an air-core structure in light of the magnetic saturation.

Figure 19:
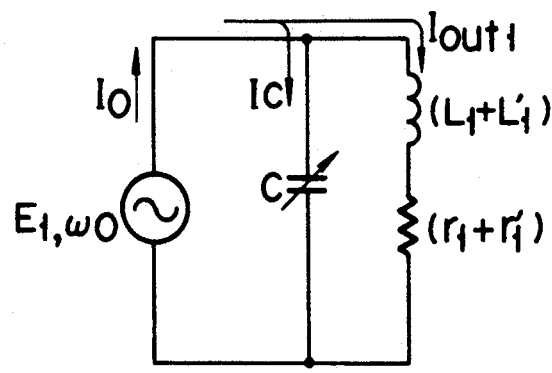
FIG. 19 is a principle diagram of the resonant type amplifier.

The LPFs 28, 32, 38, and 40 hardly affect the resonant frequency of the resonant type gradient field amplifier, and the ON resistances of the bi-directional switches Q1 to Q4 are negligible as they are smaller than the resistance of the gradient field coil. Accordingly, the principle diagram of the resonant type gradient field amplifier will be as shown in FIG. 19. The resonant angular frequency $\omega_o$ will be expressed as follows:

$$\omega_o = 1/\sqrt{(L1 + L1')C} \quad (11)$$

Since $$I_o = E1/\{(L1 + L1')/C(r1 + r1')\} \quad (12)$$
$$Iout1 = QI_o \quad (13)$$
$$Q = \omega_o(L1 + L1')/(r1 + r1'), \quad (14)$$

substituting the equations (12) and (14) into the equation (13), the resonant current Iout1 will be expressed as follows:

$$Iout1 = \sqrt{C/(L1 + L1')} \cdot E1 \quad (15)$$

From the equation (15), it is apparent that the current Iout1 flowing across the gradient field coil 30 can be controlled by the voltage E1 or the output voltage of the voltage amplifiers A1 and A2. To control E1, the voltage detector 24 is provided to provide the negative feedback to the input of the voltage amplifier A1.

Figure 9:
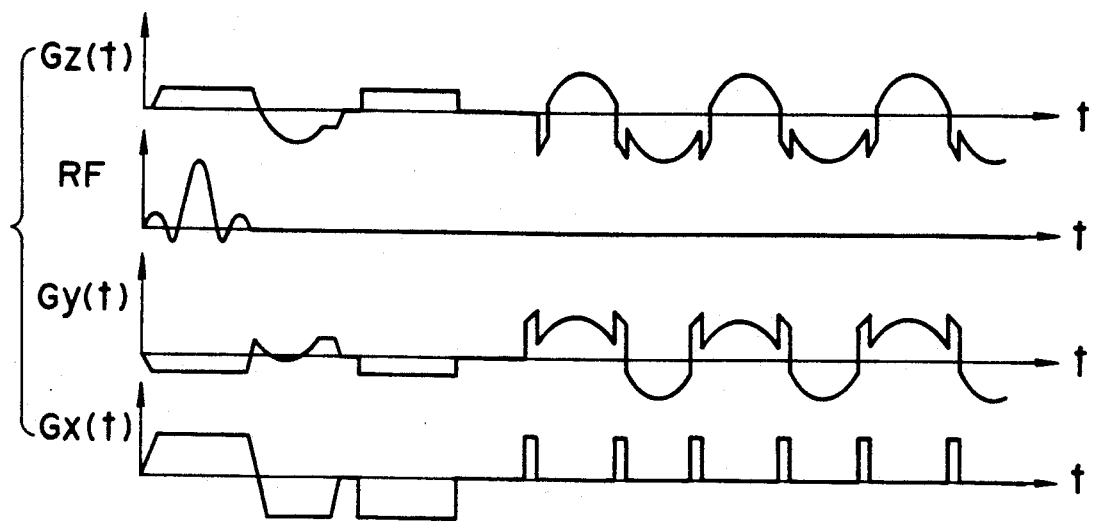
FIG. 9 is a diagram exemplifying a pulse sequence in the case where an oblique slice is scanned by the echo planar imaging method using a resonant type gradient field amplifying apparatus and two linear type transconductance amplifying apparatuses.
Figure 10:
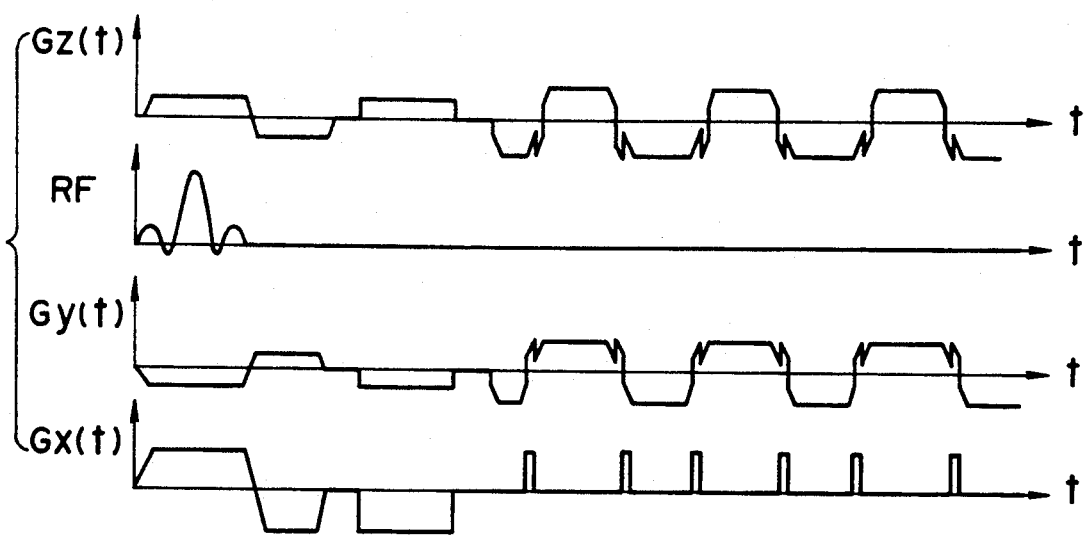
FIG. 10 is a diagram exemplifying a pulse sequence in the case where an oblique slice is scanned by the echo planar imaging method using three linear type transconductance amplifying apparatuses.
Figure 20:
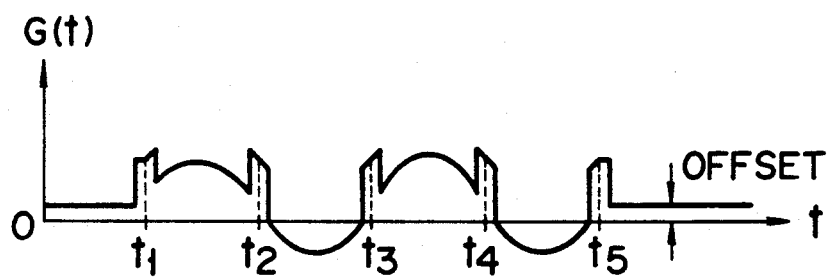
FIG. 20 shows a waveform of a gradient field generated from the gradient field amplifying apparatus shown in FIG. 12.

In general, the magnetic field generated around a conductive wire is proportional to the current flowing through the wire. The waveform of the gradient field generated by the gradient field coil 30 having two windings wound in a bifilar form is proportional to a simple linear sum of the currents Iout1 and Iout2 respectively flowing through the two windings. Adding the current waveforms as shown in FIG. 13 can yield the waveform of the gradient field as shown in FIG. 20, from which it should be understood that the gradient field amplifying apparatus shown in FIG. 12 can generate the field waveform as shown in FIG. 9. According to this embodiment, therefore, the combination of a resonant type amplifier and a linear type amplifier can realize a gradient field amplifying apparatus which can scan an arbitrary oblique slice by the echo planar imaging method without enlarging the apparatus and increasing its weight. Here, Gy(t) and Gz(t) are generated using the circuit shown in FIG. 12, while Gx(t) is generated by the linear type transconductance amplifier, such as Gm2, since the encode gradient field is smaller than the read-out gradient field, e.g., the encode gradient field is one-fifth of the read-out gradient field.

It is to be noted that the primary shim coils x, y, and z become unnecessary, since the transconductance amplifier Gm2 can flow an offset current as shown in FIG. 20. The elimination of the primary shim coils contributes to prevention of the magnetic coupling with the gradient field coil.

Figure 21:
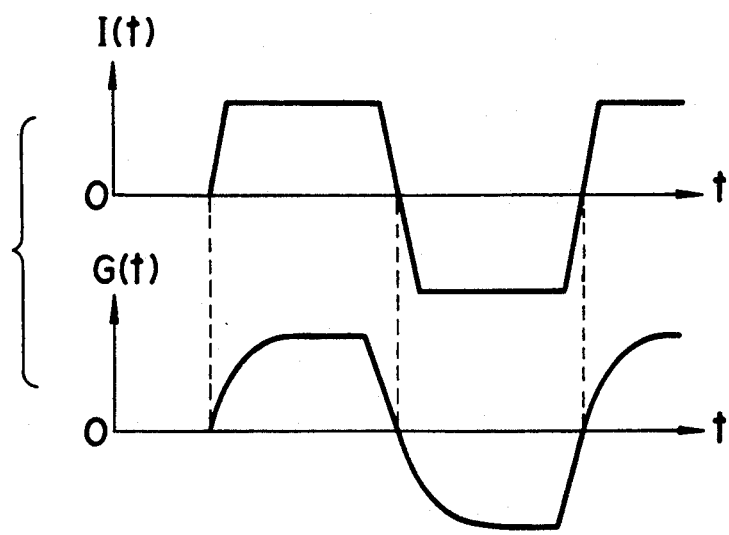
FIG. 21 shows a degradation of the gradient field waveform caused by an eddy current.

Generally, when the gradient field coil is not of an active shield type, it is necessary to compensate for an eddy current originated from the flux leak from the gradient field coil. To avoid such compensation, it is desirable to use a gradient field coil of an active shield type which sets the ratio of the current flowing through the primary coil to the current through the screen coil to be 1 : 1. From the practical point of view, even this coil needs slight compensation for an eddy current due to a variation in the characteristic of the coil caused by possible errors in the manufacturing accuracy. If the read-out gradient is to be generated from the gradient field amplifying apparatus shown in FIG. 12, as shown in FIG. 21, the field waveform G(t) slightly deforms compared with the current waveform I(t) due to the eddy current. Pre-emphasizing the current waveform I(t) as shown in FIG. 22, therefore permits the field waveform G(t) to have the desired waveform. As the transconductance amplifier Gm2 can output a current with an arbitrary waveform, such waveform compensation can easily be realized.

Figure 25:
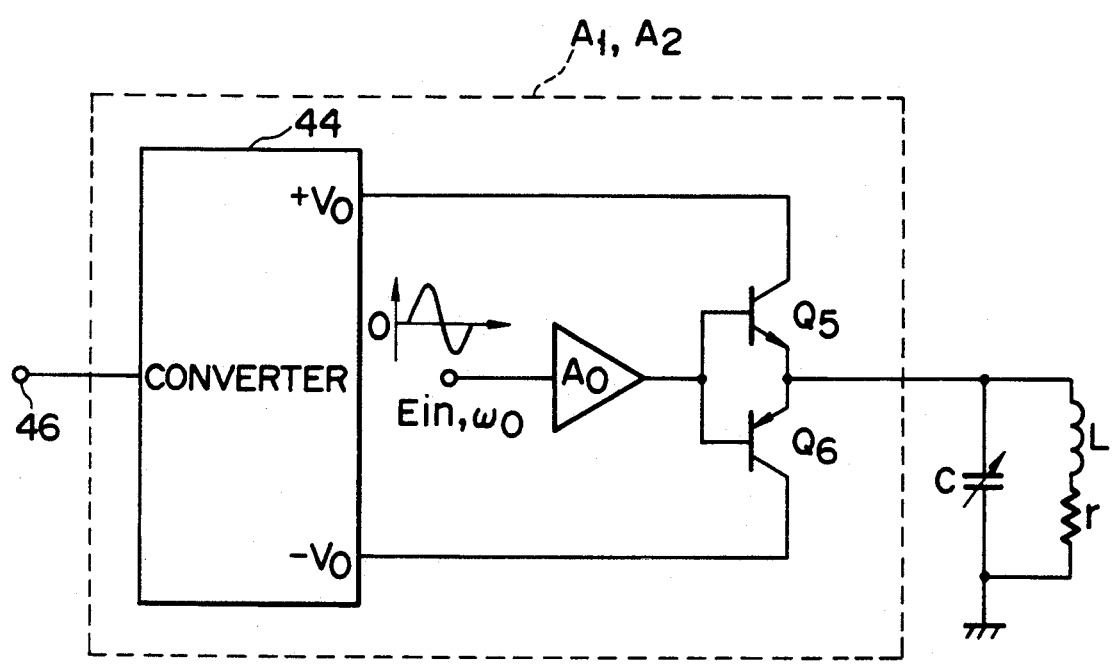
FIG. 25 is a detailed diagram of a pre-regulator configuration of the voltage amplifier included in the gradient field amplifying apparatus shown in FIG. 12.

In the resonant type gradient field amplifier, the maximum value of the output voltage of the voltage amplifiers A1 and A2 is set in advance by the sequencer 90 before the pulse sequence starts. It is therefore desirable to design the resonant type gradient field amplifier as a pre-regulator circuit to decrease the internal loss by setting the source voltages within the voltage amplifiers A1 and A2 variable. This is because that as the frequency bandwidth of the MR signal to be collected by the echo planar imaging method is approximately 300 KHz, the MR signal would be modulated unless the voltage ripple of the output voltage lies outside the signal band, whereby when an image is reconstructed, an artifact is produced. The voltage amplifiers A1 and A2 may each be designed to include a converter as shown in FIG. 25 to have the final stage configured into a linear amplifier, so that the amplifiers can have a function to eliminate a variation in source voltage to thereby suppress the ripple of the output voltage. Referring to FIG. 25, Ao is a driver amplifier. The capacitor and the gradient field coil become equivalent to a resistance (L/Cr) at the time of resonance (LC$\omega_o^2$=1).

To explain how to determine the set value of the source voltage, an equivalent circuit diagram for the case where the energy loss of the converter is neglected is illustrated in FIG. 23. FIGS. 24A to 24F respectively illustrate the output voltage E5 (maximum value being E5m) at the final stage in the arrangement of FIG. 23, the output current I5 (maximum value being Im5), the collector-emitter voltage VCE5 of a transistor Q5, the collector current Ic5 of the transistor Q5, power loss Pc5 (=VCE5 Ic5) at the transistor Q5, and power loss Pc6 (=VCE6 Ic6) at a transistor Q6. As the energy loss in the converter is small, it is neglected. With the period being $2\pi/\omega_o$, the average total loss Pc=Pc5+Pc6 will be expressed as follows:

$$Pc = \{2/(2\pi/\omega_o)\} \cdot \qquad (16)$$
$$\int\{(V_o - e5m \cdot \sin\omega_o t)(Ic5m \cdot \sin\omega_o t)\}dt$$
$$= (4Vo - \pi \cdot E5m)Ic5m/2\pi$$
$$\text{where } 0 \leq E5m \leq Vo.$$

Since the peak output voltage E5m and peak output current Ic5m are specifically determined before the pulse sequence starts, it is apparent that the source voltage Vo has only to be set equal to E5m in order to minimize the average total loss that determines most of the entire power loss of the voltage amplifiers. Actually, Vo needs to be set slightly higher than this value due to the collector-emitter saturation voltage and the margin voltage.

As a result, the DC source voltage±Vo is generated by a converter 44 whose output voltage is variable, as shown in FIG. 25. It is preferable that the converter 44 has a high efficiency and small ripple. With the margin taken into consideration, a control signal 46 of the converter 44 is set so as to make Vo=1.5.E5m, for example. This setting can suppress the power loss in the voltage amplifiers as much as possible.

According to the first embodiment, as described above, the output of the resonant type amplifier and the output of the linear type amplifier are connected to the respective windings of the bifilar-winding gradient field coil and the cancel coil is connected to the gradient field coil, so that it is possible to generate a gradient field proportional to the linear sum of the outputs of the two amplifiers, thus permitting the gradient field amplifying apparatus to scan an arbitrary oblique slice using the echo planar imaging method.

According to the first embodiment, the primary shim coil becomes unnecessary, since the transconductance amplifier can flow an arbitrary waveform current, i.e., an offset current. As a result, the magnetic coupling between the shim coil and the gradient field coil can be prevented. Further, the transconductance amplifier is able to pre-emphasize the current waveform so that the gradient field can have a desired waveform compensating for the effect of the eddy current. The ripple of the output voltage can be suppressed by the source voltage variation elimination function of the resonant type gradient field amplifier of which voltage amplifier includes a converter and final stage is configurated as a linear amplifier.

Figure 26:
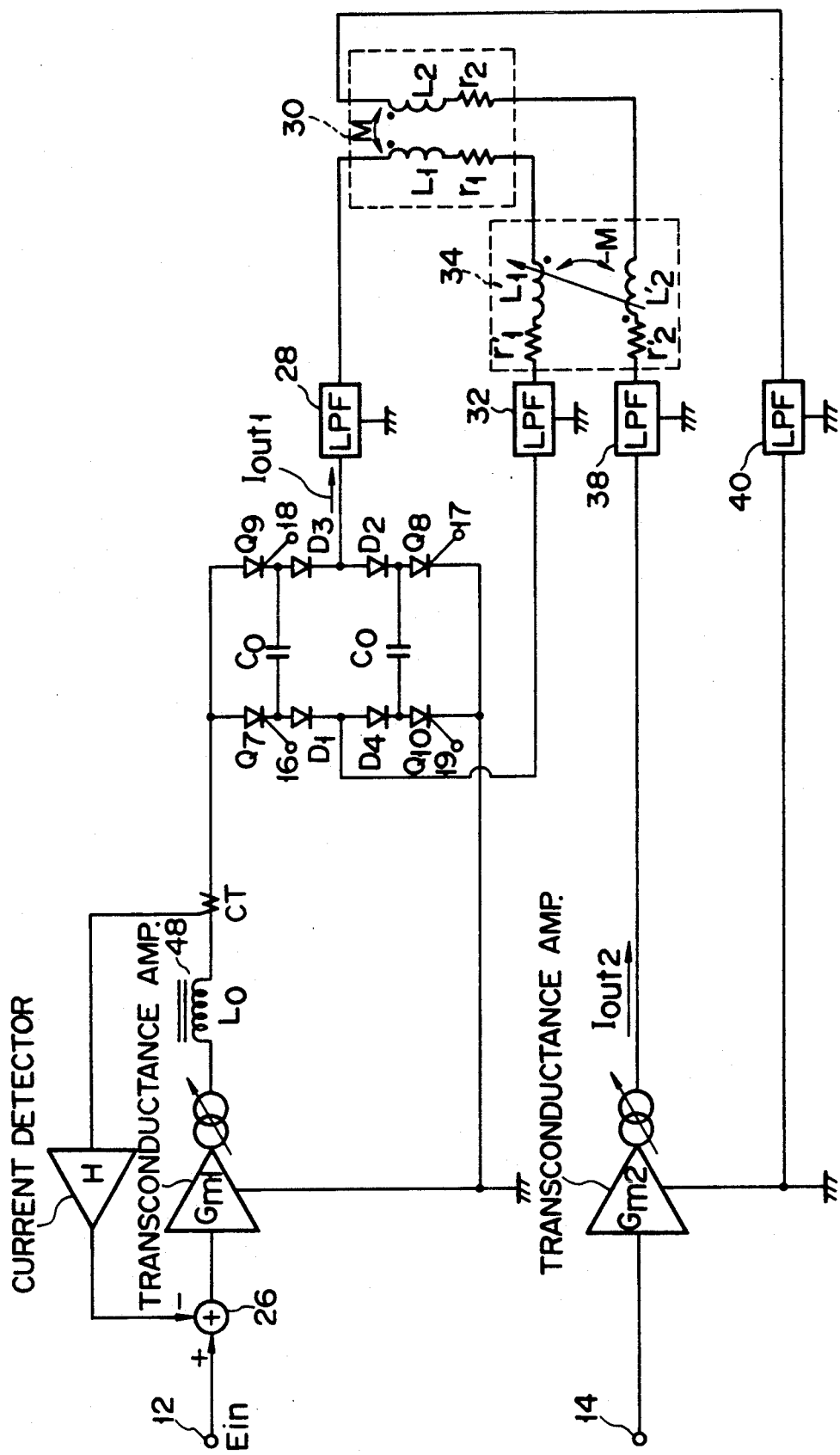
FIG. 26 is a block diagram illustrating a gradient field amplifying apparatus used in an MRI system of a second embodiment according to the present invention.
Figure 27:
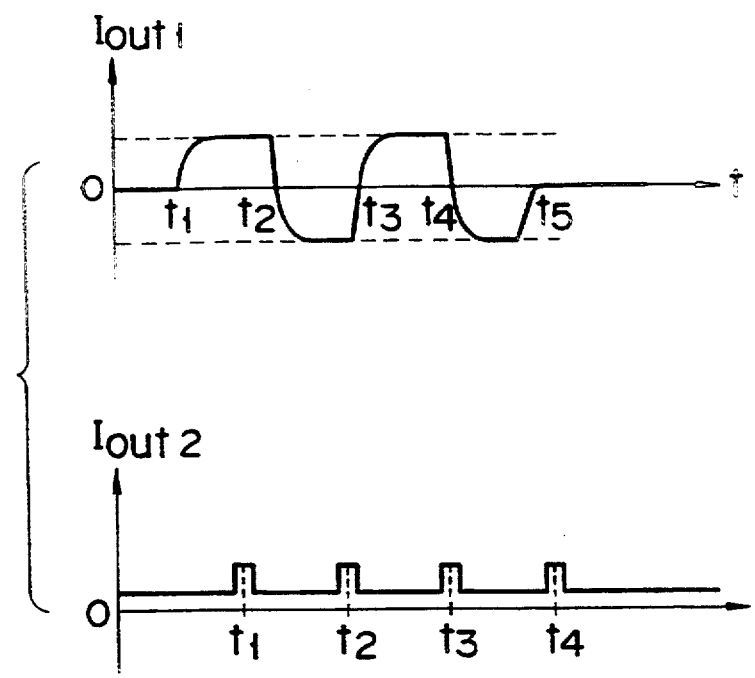
FIG. 27 shows current waveforms of the second embodiment.

The second embodiment will now be described. FIG. 26 is a block diagram illustrating the gradient field amplifying apparatus used in the second embodiment. The arrangement of the second embodiment is the same as that of the first embodiment, except that a current type inverter is used in the second embodiment, instead of the resonant type amplifier in the first embodiment. FIG. 27 shows waveforms of currents Iout1 and Iout2 flowing through both windings of the bifilarwinding gradient field coil 30. Using the current type inverter, the read-out gradient field is constant during collecting the MR signal. Sampling of the MR signal at unequal intervals or interpolation after over-sampling of the signal is therefore unnecessary, while it is required when the resonant type amplifier is used. In other words, only the normal sampling at equal intervals is required.

The current type inverter will now be explained in detail. It is required that an iron core or a toroidal core is used for a choke coil (Lo) 48 to improve the inductance.

It is preferable that a transconductance amplifier Gm1 for used in the current type inverter is constituted by the pre-regulator circuit to control the ripple of the output current and decrease the power loss to the minimum, as in the first embodiment. The output current of the transconductance amplifier Gm is determined in advance by the sequencer 90 before the pulse sequence starts. Further, a choke coil Lo ($>>$L1, L2, L1', L2') is provided on the side of the output. Therefore, the output current will not significantly vary even if the switching elements Q7 to Q10 are rendered on or off during the scanning, and a given high voltage does not have to be applied to keep the constant-current characteristic. Thyristors or GTO's serve as the switching elements Q7 to Q10. Co represents a commutation capacitor and also has a function to control a switching time.

Figure 28:
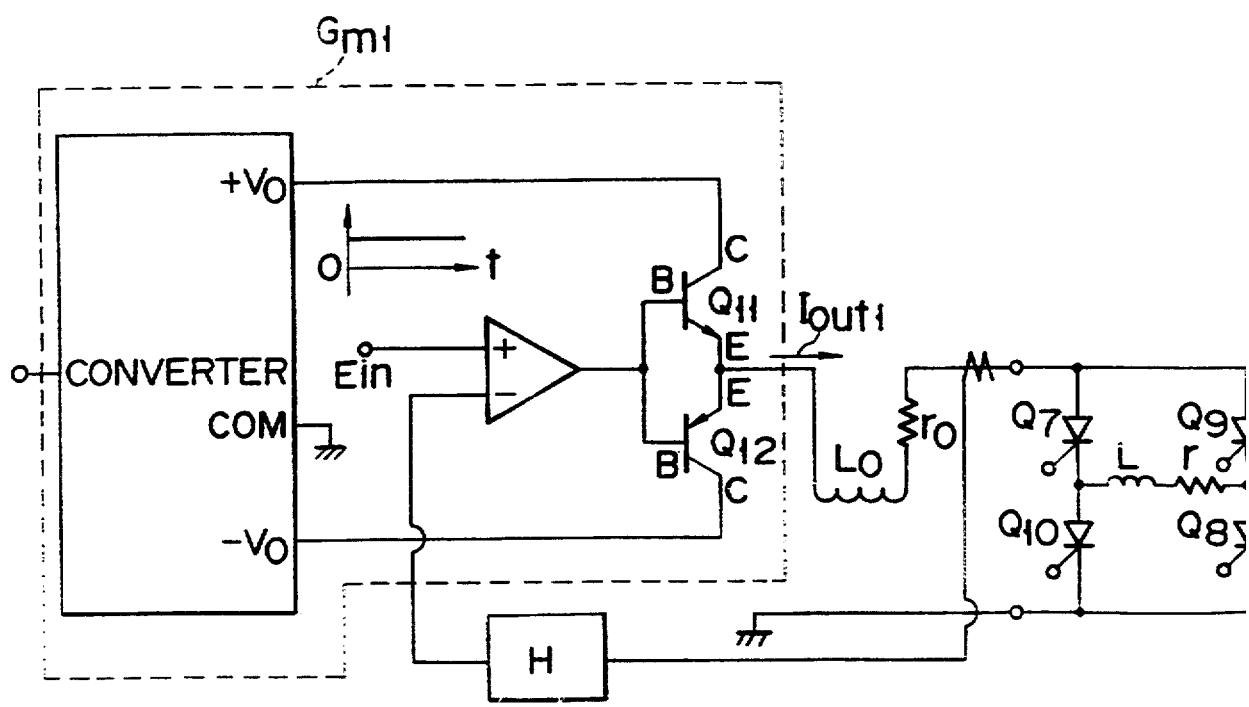
FIG. 28 is a detailed diagram of a transconductance amplifier included in a current type inverter used in the second embodiment.

FIG. 28 illustrates a detail of the transconductance amplifiers Gm1 and Gm2. When saturation voltages between the collectors and emitters of the transistors Q11 and Q12 are $VCE_{sat}$, ON-voltages of the switching elements Q7 to Q10 are VT, a DC resistance of the choke coil Lo is ro, the total DC resistance of the gradient field coil and the cancel coil is r, the following equations are provided:

$$Vo_{min} = VCE_{sat} + 2VT + Ioutl(ro + r) \quad (17)$$

$$Vo = VCE + 2VT + Ioutl(ro + r) \quad (18)$$

$$(Vo \geq Vo_{min})$$

The most of the power loss inside the transconductance amplifier is determined by the loss in the final transistor, Pc = VCE Iout1. It is to be understood therefore that if VCE or Vo has a low value as possible, the power loss can be decreased.

The general operation of the current type inverter will now be described. The switching elements Q7 and Q10 are turned on, and the switching elements Q8 and Q9 are rendered off. Q7 and Q10 may be off, and Q8 and Q9 may be on. Under these circumstances, according to the control signal, the transconductance amplifier controls the output current Iout1 to be constant. The operation is all done to be ready for the start of the pulse sequence. When the scanning begins, a control signal is sent from the sequencer 90 to render the switching elements Q7 and Q8 on, and Q9 and Q10 off (or render Q9 and Q10 on, and Q7 and Q8 off). The current flowing through the gradient field coil 30 is repetitively switched positive or negative. In other words, a gradient field being repeated in rectangular shape is generated. Finally, the operation is stopped with the switching elements Q7 and Q10 on and Q8 and Q9 off (or with Q8 and Q9 on, and Q7 and Q10 off).

As apparent from the above description, it is possible according to the second embodiment to generate gradient fields having waveforms shown in FIG. 9, which are required for scanning an arbitrary oblique slice. The other effects described in the first embodiment can be acquired also in the second embodiment. Further, according to the second embodiment, the gradient field amplifying apparatus using the current type inverter can generate the constant read-out gradient field during collecting the MR signal. Therefore, sampling of the MR signal at unequal intervals or interpolation after oversampling of the signal is unnecessary, while it is required when the resonant type amplifier is used.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, a gradient field coil may be formed in a multifilar form to provide multiple coils of the type as shown in FIG. 12 or FIG. 26, which are to be driven in parallel.

According to the present invention, the outputs of two amplifiers having different power efficiencies and different output waveforms are connected to the bifilar-winding gradient field coil and a cancel coil is connected to the gradient field coil, it is possible to generate a gradient field proportional to the linear sum of the outputs of the two amplifiers, thus permitting an MRI system having a compact, light gradient field amplifying apparatus to scan an arbitrary oblique slice using the echo planar imaging method.

What is claimed is:

1. A magnetic resonance imaging system comprising:
   means for generating a static field;
   means for generating a gradient field which is superposed on the static field, the gradient field generating means comprises:
      first means for outputting a first current of a given waveform;
      second means for outputting a second current of an arbitrary waveform at a lower level than that of said first current;
      a gradient field coil having first and second windings for respectively running said first and second currents, the first and second windings being provided closely and wound to respectively generate gradient fields in the same direction;
      means, connected in series to said gradient field coil, for cancelling a voltage induced on said first winding based on a current flowing through said second winding and cancelling a voltage induced no said second winding based on a current flowing through said first winding;
   means for transmitting a radio-frequency pulse; and
   means for receiving a magnetic resonance echo signal from an object.

2. A system according to claim 1, further comprising pulse sequence control means for controlling said gradient field generating means to generate an echo planar imaging pulse sequence and for generating from said first means a read-out gradient field and from said second means a sum of a slice gradient field, an encode gradient field, an offset gradient field for shimming the uniformity of the static field, and a gradient field for compensating for an eddy current.

3. A system according to claim 1, wherein said first means comprises a resonant type amplifier and said second means comprises a linear type transconductance amplifier.

4. A system according to claim 1, wherein said first means comprises a current type inverter and said second means comprises a linear type transconductance amplifier.

5. A system according to claim 1, wherein said gradient field generating means comprises first, second, and third directional gradient field generating means corresponding to X, Y, and Z corresponding to orthogonal directions of a cartesian coordinate system, two of said first to third gradient field generating means comprising:
first means for outputting a first current of a given waveform;
second means for outputting a second current of an arbitrary waveform at a lower level than that of said first current;
gradient field coil formed of first and second windings for respectively running said first and second currents, the first and second windings being provided closely and wound to generate gradient fields in the same direction; and
means, connected in series to said gradient field coil, for cancelling a voltage induced from said gradient field coil, and
the remaining one of said first to third gradient field generating means comprising:
means for generating a current of an arbitrary waveform at a lower level than that of said first current.

6. A system according to claim 5, wherein said two of said first to third gradient field generating means generate a gradients field including a read-out gradient component and si remaining one of said first to third gradient field generating means generates a gradient field excluding a read-out gradient component.

7. A system according to claim 5, wherein said remaining one of said first to third gradient field generating means comprises a linear type transconductance amplifier.

8. A system according to claim 1, wherein said voltage canceling mean comprises a coil having first and second windings respectively connected in series to said first and second windings of said gradient field coil, the first and second windings of said gradient field coil, the first and second windings of said canceling means having a mutual inductance equal to a mutual inductance of the first and second windings of said gradient field coil.

9. A gradient field amplifying apparatus comprising:
first means for outputting a first current of a given waveform;
second means for outputting a second current of an arbitrary waveform at a lower level than that of said first current;
a gradient field coil for running said first and second currents and generating a gradient field corresponding to a sum of said first and second currents; and
a cancel coil, connected in series to said gradient field coil, for cancelling a voltage induced on said gradient field coil based on a current flowing through said field coil.

10. An apparatus according to claim 9, wherein said first means comprises a resonant type amplifier and said second means comprises a linear type amplifier.

11. An apparatus according to claim 10, wherein said resonant type amplifier comprises a voltage amplifier and a resonant circuit connected to the voltage amplifier and fed with an output of the voltage amplifier, the voltage amplifier being of a pre-regulator configuration and formed of a converter providing a predetermined voltage sources to the voltage amplifier, and said second means comprises a linear type transconductance amplifier.

12. An apparatus according to claim 9, wherein said first means comprises a current type inverter and said second means comprises a linear type amplifier.

13. An apparatus according to claim 12, wherein said current type inverter comprises a linear type transconductance amplifier connected to a source terminal of the current type inverter, a choke coil for running an output of the linear amplifier, and a bridge circuit for switching an output of the choke coil, and said second means comprises a high power linear type transconductance amplifier.

14. An apparatus according to claim 13, wherein said high power linear type amplifier comprises a voltage amplifier of a pre-regulator configuration.

15. An apparatus according to claim 9, wherein said gradient field coil has first and second windings for respectively running said first and second currents, the first and second windings being wound in a bifilar form, and said cancel coil has third and fourth windings for respectively connected between said first means and said first winding and between said second means and said second winding.

16. An apparatus according to claim 9, wherein said gradient field coil has first and second windings for respectively running said first and second currents, the first and second windings being wound in a nesting form, and said cancel coil has third and fourth windings for respectively connected between said first means and said first winding and between said second means and said second winding, the third and fourth windings being wound in a nesting form.

17. An apparatus according to claim 15, wherein said cancel coil is of an air-core type.

18. An apparatus according to claim 9, wherein said second current includes a waveform correction component for compensating for an eddy current.

19. An apparatus according to claim 15, wherein said second current includes an offset component for shimming the uniformity of the static field.

20. An apparatus according to claim 8, wherein said cancel coil is an air-core coil.

* * * * *

UNITED STATES PATENT AND TRADEMARK OFFICE
CERTIFICATE OF CORRECTION

PATENT NO. : 5,235,281
DATED : August 10, 1993
INVENTOR(S) : Motoji Haragashira, et al It is certified that error appears in the above-indentified patent and that said Letters Patent is hereby corrected as shown below:

Drawing Sheet 15, consisting of Figure 26, should be deleted to be replaced with the Drawing Sheet, consisting of Figures 27-28, as shown on the attached page.

Signed and Sealed this

Second Day of April, 1996

Attest:

BRUCE LEHMAN

*Attesting Officer*  *Commissioner of Patents and Trademarks*